United States Patent [19]

Tabata

[11] Patent Number: 4,590,382
[45] Date of Patent: May 20, 1986

[54] METHOD OF ALIGNING TWO MEMBERS UTILIZING MARKS PROVIDED THEREON

[75] Inventor: Mitsuo Tabata, Yokohama, Japan

[73] Assignee: Kabushiki Kaisha Toshiba, Kawasaki, Japan

[21] Appl. No.: 613,732

[22] Filed: May 24, 1984

[30] Foreign Application Priority Data

May 31, 1983 [JP] Japan .................................. 58-96148

[51] Int. Cl.$^4$ ...................... G01N 21/00; G01N 23/00
[52] U.S. Cl. .................................................. 250/491.1
[58] Field of Search .......................... 250/491.1, 492.2

[56] References Cited

U.S. PATENT DOCUMENTS

| | | | |
|---|---|---|---|
| 3,832,560 | 8/1974 | O'Keefe | 250/492.2 |
| 3,843,916 | 10/1974 | Trotel | 250/492.2 |
| 4,327,292 | 4/1982 | Wang et al. | 250/492.1 |
| 4,469,949 | 9/1984 | Mori et al. | 250/491.1 |

FOREIGN PATENT DOCUMENTS 53-11829  4/1978  Japan .

OTHER PUBLICATIONS

IEEE Transactions on Electron Devices, vol. ED-22, No. 7, Jul. 1975, pp. 409–413; J. P. Scott.

*Primary Examiner*—Bruce C. Anderson
*Attorney, Agent, or Firm*—Oblon, Fisher, Spivak, McClelland & Maier

[57] ABSTRACT

Alignment marks are formed on the opposite surfaces of a photoelectric mask and a wafer. Each mark has a plurality of lines provided at a predetermined pitch. Widths of the lines of the photoelectric mask are progressively increased. On the while, widths of the lines of the wafer are progressively decreased. The marks of the wafer and the mask are opposite to each other such that lines of the maximum and minimum widths are opposite to each other. The overlapping area of the marks changes quadratically as a function of positional deviation between the mask and the wafer. When the mask is irradiated with ultraviolet light, X-rays are emitted from the mark on the wafer at an intensity corresponding to the overlapping area and are detected by an X-ray detector. The intensity of X-rays emitted changes quadratically as a function of deviation. The electron beam is scanned, and a detection signal is synchronously detected. The obtained PSD signal does not have a nonsensitive region and changes linearly as a function of deviation even if the beam scan width is narrow.

6 Claims, 18 Drawing Figures

METHOD OF ALIGNING TWO MEMBERS UTILIZING MARKS PROVIDED THEREON

BACKGROUND OF THE INVENTION

The present invention relates to a method of aligning two members utilizing marks provided thereon and, more particularly, to a method of aligning a photoelectric mask and a wafer utilizing marks provided on the mask and wafer in an electron beam projecting technique.

A resist pattern can be formed on a surface of a sample, such as a silicon wafer, by scanning an electron beam of a minute size on a resist film formed on a silicon wafer to expose the resist and to form a resist pattern on the sample surface. However, according to this method, scanning the electron beam requires a long period of time so that the efficiency of forming resist patterns on wafers (wafer productivity) is low.

A mask-type transfer apparatus has been developed in order to solve this problem. In this projecting apparatus, a mask of a predetermined pattern is used, and this mask pattern is transferred onto a sample by an X-ray, an electron beam or the like. Of such projecting apparatuses, a photoelectric mask-type electron beam projecting apparatus is considered most promising for the transfer of minute patterns. According to the apparatus of this type, a magnetic field and an electric field are applied between a mask and a sample, and photoelectrons emitted from the mask upon being irradiated with ultraviolet light are focused onto the sample to transfer the mask pattern onto the sample.

In a projecting apparatus of this type, a method as shown in FIG. 1 is used so as to match the relative positions (alignment) of a photoelectric mask and a wafer. A mask 10 and a wafer 20 are arranged at a distance of about 10 mm from each other and held in a vacuum atmosphere at about $1 \times 10^{-6}$ Torr. The mask 10 has a quartz substrate 12 capable of transmitting ultraviolet light, a light-shielding film 14 formed below the substrate 12 and made of a material such as chromium which is capable of shielding ultraviolet light, and a photoelectric film 16 coated below the substrate 12 and made of a material such as CsI which is capable of emitting photoelectrons upon being irradiated with ultraviolet light. A mark 18 is defined by a photoelectric material pattern replacing part of the light-shielding film 14. A mark 26 of a heavy metal such as tantalum, tungsten or molybdenum or a heavy metal compound is formed on the upper surface of the wafer 20 such as a silicon wafer. The wafer 20 is supported on a support 22. An X-ray detector 30 is arranged below the wafer 20.

The marks 18 and 26 have the same shape, for example, a rectangular shape. Assume that the wafer 20 is moved to the left in FIG. 1. The positional deviation of the wafer 20 with reference to 0 deviation obtained when the marks 18 and 26 are aligned is represented by D. Fig. 2 is a graph showing the vertical overlapping area S between the marks 18 and 26 as a function of the positional deviation D. When the length of each of the marks 18 and 26 is represented by d, the overlapping area S increases linearly as the deviation D becomes smaller than the length d and becomes at its maximum when the deviation D is zero.

When the photoelectric mask 10 is irradiated with ultraviolet light and when a magnetic field and an electric field (indicated by arrows) are applied between the mask 10 and the wafer 20 to be perpendicular to their surfaces, electron beams are generated from the mark 18 and are accelerated along these arrows. When the accelerated electron beams are bombarded against a metal target consisting of the mark 26 and the wafer 20, the electrons are decelerated upon collision with the nuclei of the target metal, and part of the kinetic energy of the electrons is emitted as X-rays. The intensity of the generated X-rays depends on the atomic number Z of the target metal, that is, the larger the Z, the larger the intensity of X-rays generated, provided that the energy of the electron beams and the thickness of the target are the same. Therefore, when electron beams are irradiated onto a metal target, the intensity of X-rays emitted from the mark 26 of a heavy metal is larger than that from the silicon wafer 20. Thus, the deviation D and the X-ray output hold the relationship as shown in FIG. 3. The wafer 20 is moved while the intensity of X-rays generated from the metal target is detected by the X-ray detector 30. When the wafer 20 is stopped at a position where the X-ray output is maximum, the marks 18 and 26 are aligned. Alternatively, the mask 10 and wafer 20 are aligned by deflecting the magnetic field applied between the mask and wafer by the magnetic field from a deflection coil by an amount corresponding to the positional deviation detected by the X-ray detector.

In this aligning method, the alignment precision is dependent on the S/N ratio of the detection signal. Since the intensity of X-rays is very small, the mark area must be increased to increase the level of the detection signal. On the other hand, the mark width must be reduced in order to improve the position detection resolution. However, when the mark width is reduced, the detection range is also reduced. In order to solve this contradictory problem, a coarse/fine alignment method using a mask pattern as shown in FIG. 4 is proposed in a document (J. P. Scott: The Electrochemical Society: (1974), p. 123). According to this method, the alignment mark consists of a coarse alignment pattern and a fine alignment pattern. Each of these patterns consists of lines and spaces which are arranged at equal intervals. When lines and spaces are arranged at equal intervals, the mark area can be increased without widening the line width. In addition to this, the position detection range can be widened by performing alignment in steps of coarse and fine alignment. Output characteristics of X-rays obtained by a method utilizing such a mark consist of a combination of the signal component from the coarse alignment and that from the fine alignment, as shown in FIG. 5. When coarse alignment is performed, the positional deviation in a coarse alignment region cannot be detected due to the influence of the signal component from the fine alignment. Therefore, it is difficult to obtain a detection range of fine alignment. A method is plausible wherein coarse and fine alignment regions are preset separately and separate detectors are arranged for the respective regions, so that coarse and fine alignments are performed with the separate detectors. However, in this case, the numbers of marks and detectors are increased to render the overall apparatus complex. Moreover, the transfer region of the wafer is reduced, resulting in a problem.

The above-identified document proposes another method of removing the influence of a signal component from a fine alignment pattern. According to this method, a current including an AC component is made to flow in a deflection coil to deflect an electron beam in an AC manner (AC deflection). Synchronous detection (lock in detection, phase sensitive detection, hereafter abbreviated as PSD) of an output signal is performed utilizing the modulated signal of an electron beam obtained by AC deflection. In this method, a rectangular wave is used as the AC wave, and the deflecting amplitude (scan width of the electron beam) is selected to be a multiple integral of the pitch of a fine alignment pattern consisting of lines and spaces. In the output obtained after this signal processing, the signal component from the fine alignment pattern is normally 0, and only the signal component from the coarse alignment pattern needs to be considered. The PSD processed output obtained in this manner is shown in FIGS. 6 and 7.

FIG. 6 shows a PSD output when the beam scan width is a multiple integral of a fine alignment pattern and is half of the pitch of the coarse alignment pattern. Meanwhile, FIG. 7 shows a PSD output when the beam scan width is a multiple integral of the pitch of the fine alignment pattern and is smaller than half of the pitch of the coarse alignment pattern. When the beam scan width is small (FIG. 7), a flat region (nonsensitive region) is present in the PSD output characteristics. In this flat region, positional deviation cannot be detected. In order to eliminate this flat region, the beam scan width must be large. However, in an electron beam transfer apparatus, it is difficult in practice to scan an electron beam within a great amplitude due to various limitations such as the coil arrangement, heat generation, and performance required for the deflection coil power supply. Therefore, it is difficult to keep the scan width of the electron beam to be below half the pitch of the coarse alignment pattern. Thus, the nonsensitive region cannot be prevented.

Another technique has been recently proposed which uses a superconductive coil as a focusing coil. According to this technique, the coil is driven in a permanent current mode to reduce the defocusing of photoelectrons due to power supply fluctuations or ripple components, and to prevent heat generation from the coil. Thus, the adverse effects of thermal deformation and temperature fluctuation are reduced. In this apparatus, when there is an AC magnetic field fluctuation, an eddy current is induced. Then, heat is generated inside the superconductive coil to evaporate liquid helium used as a coolant. The evaporation of helium is called an AC loss. When the AC loss is great, a great load is imposed on the cooler for liquefying evaporated helium. This AC loss is increased with an increase in the scan width of the electron beam. Thus, in order to reduce the AC loss, the beam cannot be AC deflected within a great amplitude.

For these reasons, an actual PSD output has a flat nonsensitive region as shown in FIG. 7. Since the positional deviation cannot be detected within this nonsensitive region, a long time period is required to control the positional deviation to a degree that the deviation falls within the range wherein fine alignment by the fine alignment pattern can be performed. The operation for this alignment is a factor in decreasing the throughput per unit time of an electron beam transfer apparatus. Furthermore, during this alignment process, the part of the wafer except for the marks may also be irradiated with an electron beam. Therefore, in order to prevent irradiation of the wafer with an electron beam during this alignment which would adversely affect the transfer of the resist pattern, the resist sensitivity and exposure time must be selected such that the radiation of the electron beam during a projection or exposure well exceeds that during alignment. In a conventional method, lengthy alignment is performed. Therefore, the exposure time must also be increased since the level of radiation for projection or exposure must be higher than that for alignment. This decreases the throughput. In this manner, in a conventional coarse/fine alignment method, coarse alignment requires a long period of time, which decreases the transfer throughput.

SUMMARY OF THE INVENTION

It is an object of the present invention to provide a method of aligning two members by utilizing marks on the two members and PSD, which allows alignment of the relative positions of the two members within a short period of time and with a short scan width of electron beam, and which can improve the transfer throughput when the method is applied to alignment in an electron beam projecting apparatus.

According to the present invention, there is provided a method of aligning first and second members by utilizing first and second marks provided on the first and second members, respectively. The first member is irradiated with an energy beam to allow the first mark to emit an electron beam which is irradiated onto the second member. The electron beam is deflected to scan the second mark. A second energy beam emitted from the second mark upon irradiation of the second member with the electron beam is detected. A detection signal of the second energy beam is synchronously detected to provide a PSD signal. The relative deviation between the first and second members is obtained based on the detection signal and/or the PSD signal. The first and second members are then properly aligned based on this deviation.

The first mark has a first alignment pattern consisting of lines and spaces which do and do not, respectively, emit an electron beam upon irradiation with an energy beam. The second mark has a second alignment pattern consisting of lines and spaces which emit a second energy beam upon irradiation with an electron beam. The second energy beam emitted from the lines is stronger than that emitted from the spaces. The overlapping area of the lines of the first and second alignment pattern changes approximately in accordance with a quadratic curve or a curve given by an equation of higher degree, which represents the positional deviation between the first and second members.

According to the present invention, a PSD output is obtained which linearly changes within a wide range and has no nonsensitive region. Alignment can be completed quickly to allow the overall alignment to be performed within a short period of time. When the method of the present invention is applied to alignment in an electron beam projecting apparatus, the projecting throughput can be improved significantly. Furthermore, since a deflection magnetic field for deflection in a large range need not be applied, the decrease in the alignment precision due to heat generated from a deflection coil or AC loss of the focusing coil using a superconductive magnet can be reduced. The reliability of the electron beam projecting apparatus can thus be improved.

BRIEF DESCRIPTION OF THE DRAWINGS

FIGS. 1 to 7 are views for explaining a conventional aligning method, in which FIG. 1 is a view showing the principle of alignment of two members, FIG. 2 is a graph showing the overlapping area of marks as a function of deviation, FIG. 3 is an X-ray output as a function of deviation, FIG. 4 is a representation showing the shape of a mark, FIG. 5 is a graph showing the X-ray output as a function of deviation, and FIGS. 6 and 7 are respectively graphs showin PSD outputs as a function of deviation;

FIGS. 8 to 16 are views showing an embodiment of the present invention, in which FIG. 8 is a schematic view showing an electron beam transfer apparatus, FIG. 9 is a representation showing a first mark, FIG. 10 is an enlarged view of a coarse alignment pattern of the first mark, FIG. 11 is a representation showing a second mark, FIG. 12 is an enlarged view of a coarse alignment pattern of the second mark, FIG. 13 is a graph showing the X-ray output from a coarse alignment pattern as a function of deviation, FIG. 14 is a graph showing the X-ray output from a fine alignment pattern as a function of deviation, FIG. 15 is a graph showing the overall X-ray output as a function of deviation, and FIG. 16 is a graph showing the PSD output as a function of deviation.

DETAILED DESCRIPTION OF THE PREFERRED EMBODIMENTS

Figure 8:
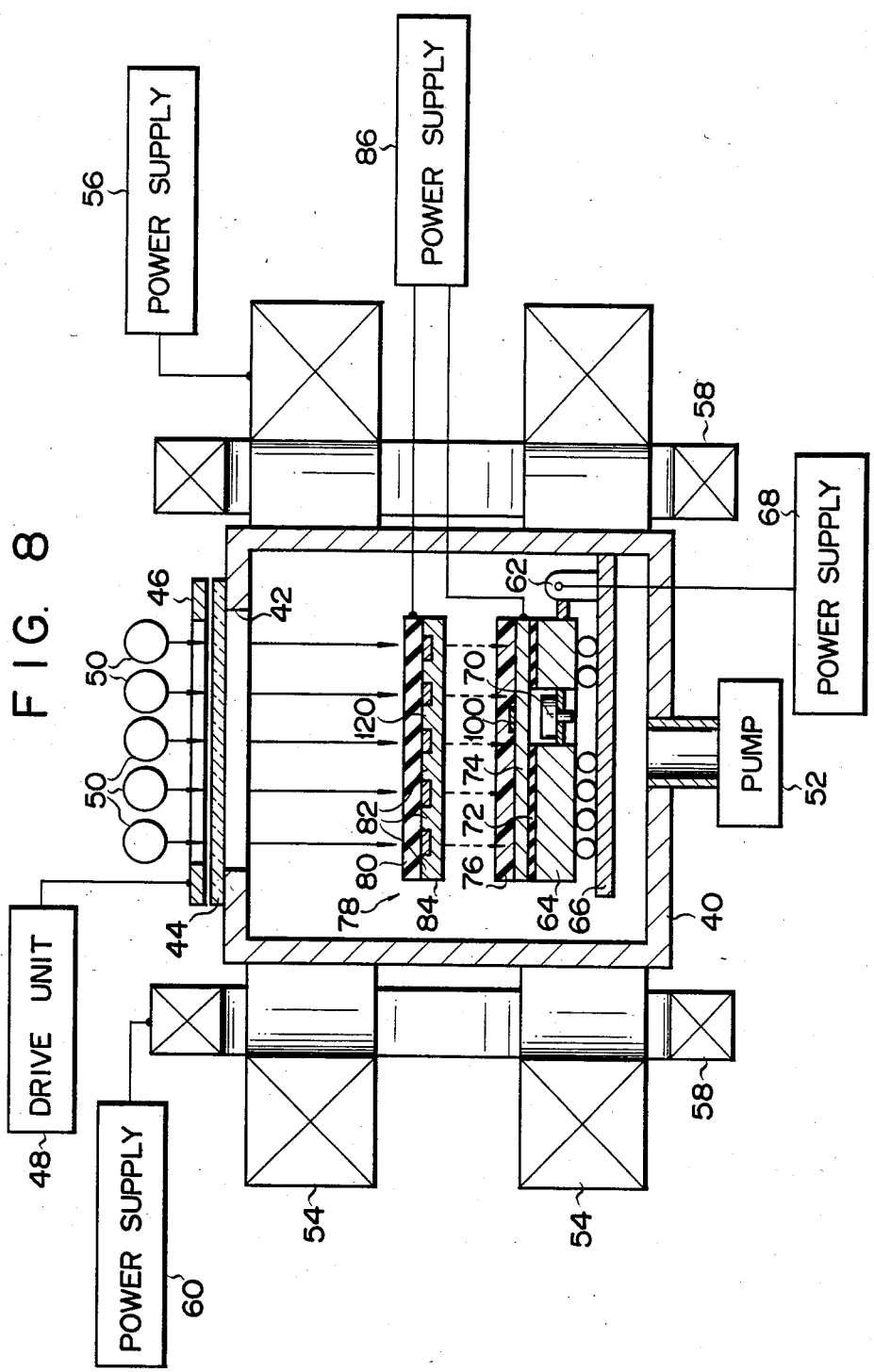

An embodiment of the present invention as applied to an electron beam projecting alignment method for aligning a photoelectric mask and a wafer will now be described. FIG. 8 shows a photoelectric mask-type electron beam projecting apparatus. A vacuum pump 52 is connected to a container 40. An optical window 42 is formed in the upper wall of the container 40. A transparent plate 44 is fixed on the upper wall of the container 40 so as to close the window 42. The container 40 together with the transparent plate 44 define a closed space. The interior of the container 40 is evacuated by the vacuum pump 52 to a vacuum pressure of about $1 \times 10^{-6}$ Torr. A carriage 64 is movably supported on a support 66 inside the container 40. A drive unit 62 for moving the carriage 64 is placed on the support 66. A power supply 68 arranged outside the container 40 is connected to the drive unit 62. When power is supplied from the power supply 68, the drive unit 62 moves the carriage 64 by a predetermined distance. The carriage 64 is made of stainless steel or the like, and an insulating film 72 is formed thereon. A recess is formed in the carriage 64 to receive an X-ray detector 70 therein. A wafer 74 with a resist film 76 formed thereon is placed on the insulating film 72. A mask 78 is arranged above the wafer 74 at a distance of about 10 mm therefrom. A mask pattern 82 is formed on the lower surface of a quartz substrate 80. A photoelectric film 84 is formed below the mask pattern 82. A DC power supply 86 is connected between the quartz substrate 80 and the wafer 74 so as to apply an electric field between the mask 78 and the wafer 74. A voltage is applied between the carriage 64 and the wafer 74, and the wafer 74 is attracted toward the carriage 64 (electrostatic chucking).

A light source 50 for emitting ultraviolet light is arranged above the transparent plate 44. Ultraviolet light from the light source 50 is radiated into the space inside the container 40 through the transparent plate 44 and onto the mask 78. A shutter 46 capable of shielding ultraviolet light from the light source 50 is arranged between the light source 50 and the transparent plate 44.

The shutter 46 is operated by a drive unit 48. When the shutter 46 is operated, irradiation of the mask 78 with ultraviolet light is controlled. Helmholtz coils 54 are arranged around the container 40 having its axis aligned with the vertical direction. A coil power supply 56 is connected to the coils 54. When power is supplied from the coil power supply 56 to the coils 54, a magnetic field is applied between the mask 78 and the wafer 74 inside the container 40, as shown by the broken lines in FIG. 8. Deflection coils 58 are arranged around the container 40 having its axis aligned with the horizontal direction. A deflection coil power supply 60 is connected to the deflection coil 58. When power is supplied from the power supply 60, the deflection coil 58 deflects the magnetic field formed between the mask 78 and the wafer 74 by the Helmholtz coils 54.

Figure 1:
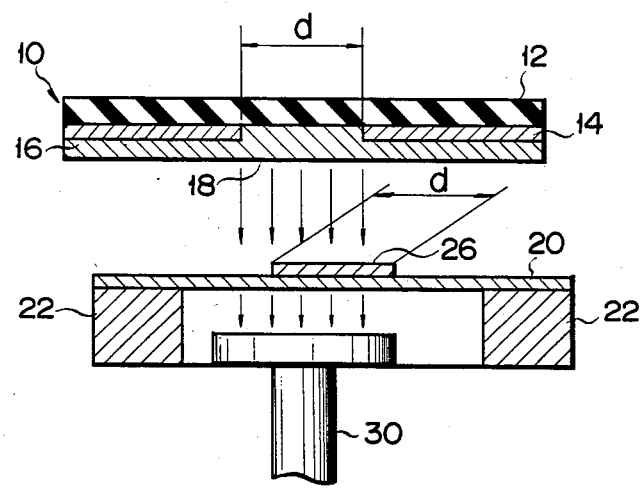
Figure 2:
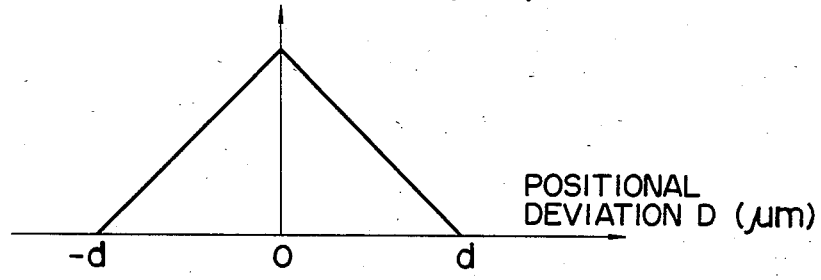
Figure 3:
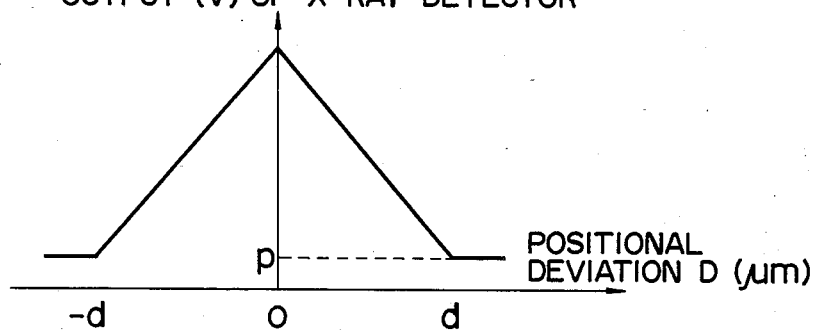
Figure 4:
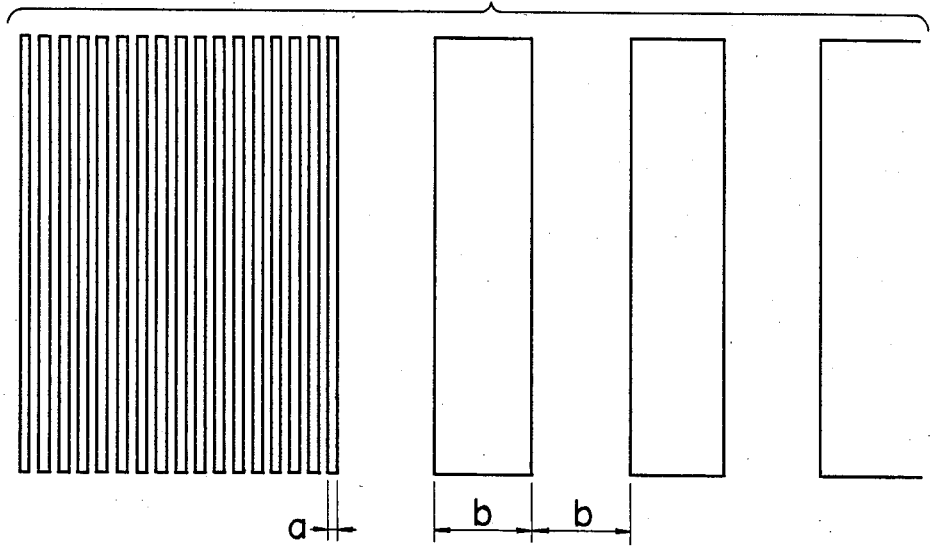
Figure 5:
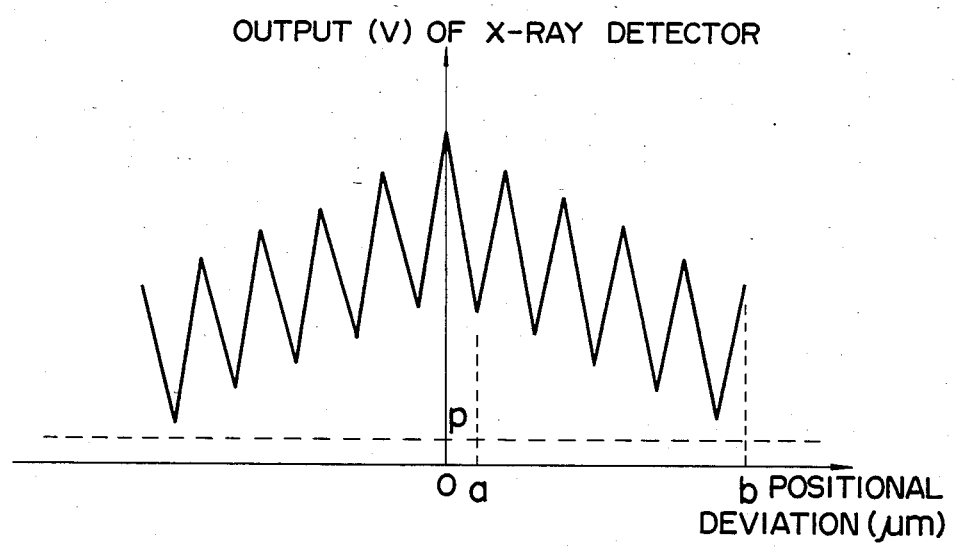
Figure 6:
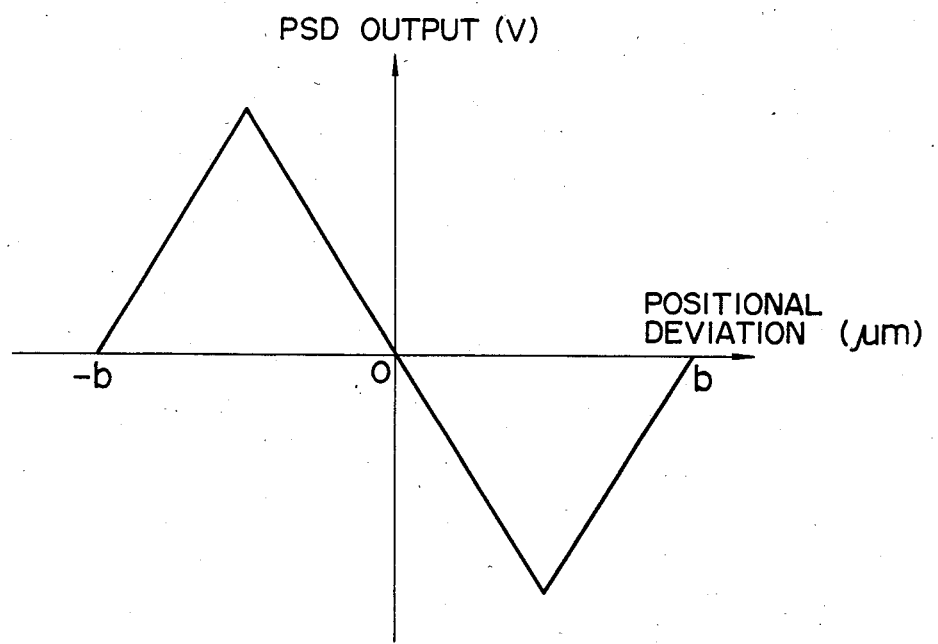
Figure 7:
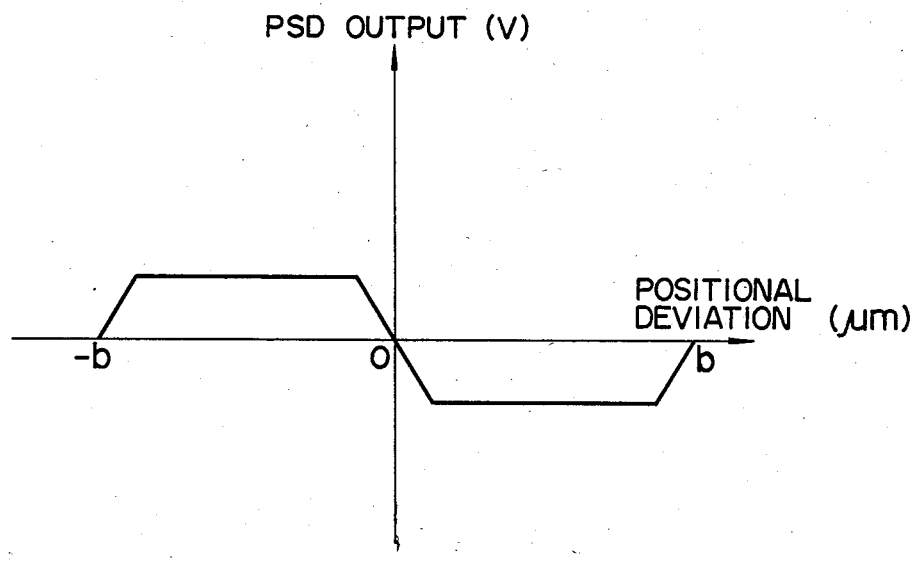

Alignment marks 100 and 120 for aligning the mask 78 and the wafer 74 are formed on the upper surface of the wafer 74 in the vicinity of the X-ray detector 70 and on the lower surface of the quartz substrate 80 of the mask 78, respectively. The mark 100 consists of a heavy metal such as tantalum, tungsten or molybdenum as in the case of the mark 26 (FIG. 1). The mark 120 is formed by removing a part of the light-shielding film formed on the lower surface of the quartz substrate 80 and replacing it with a photoelectric material, as in the case of the mark 18 (FIG. 1).

Figure 9:
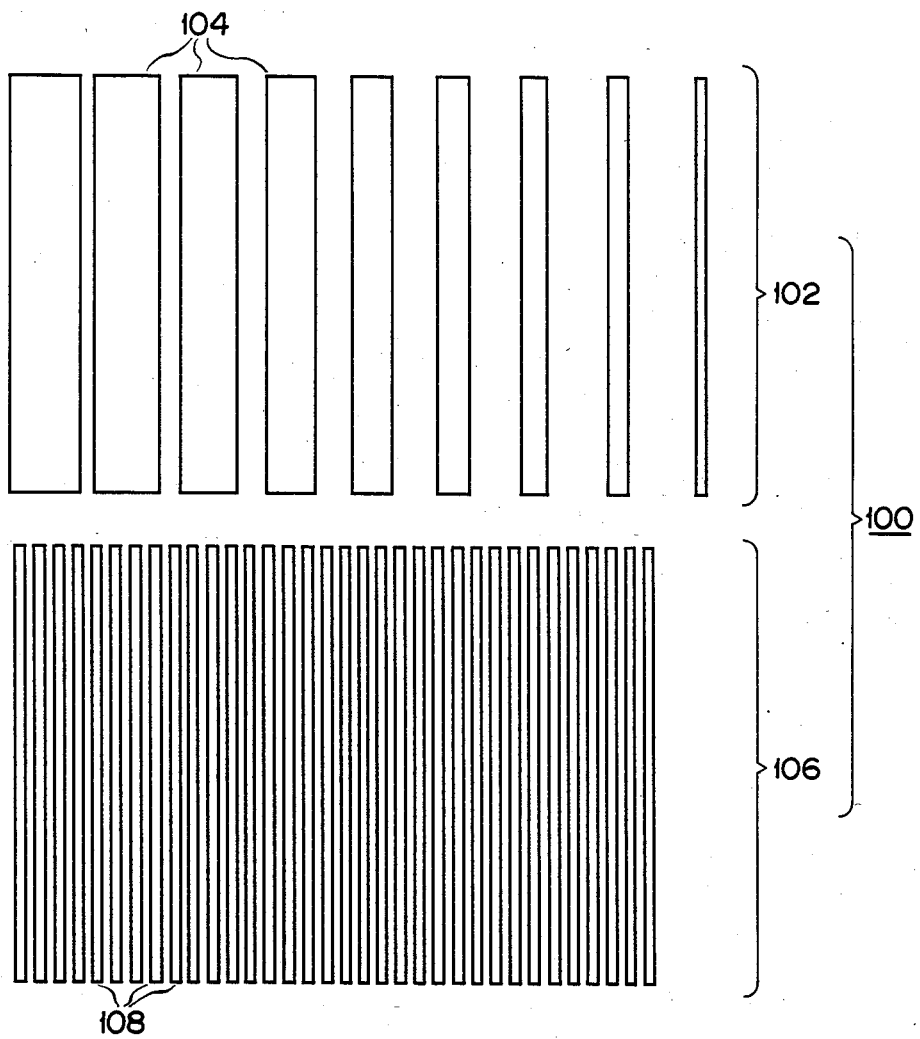
Figure 10:
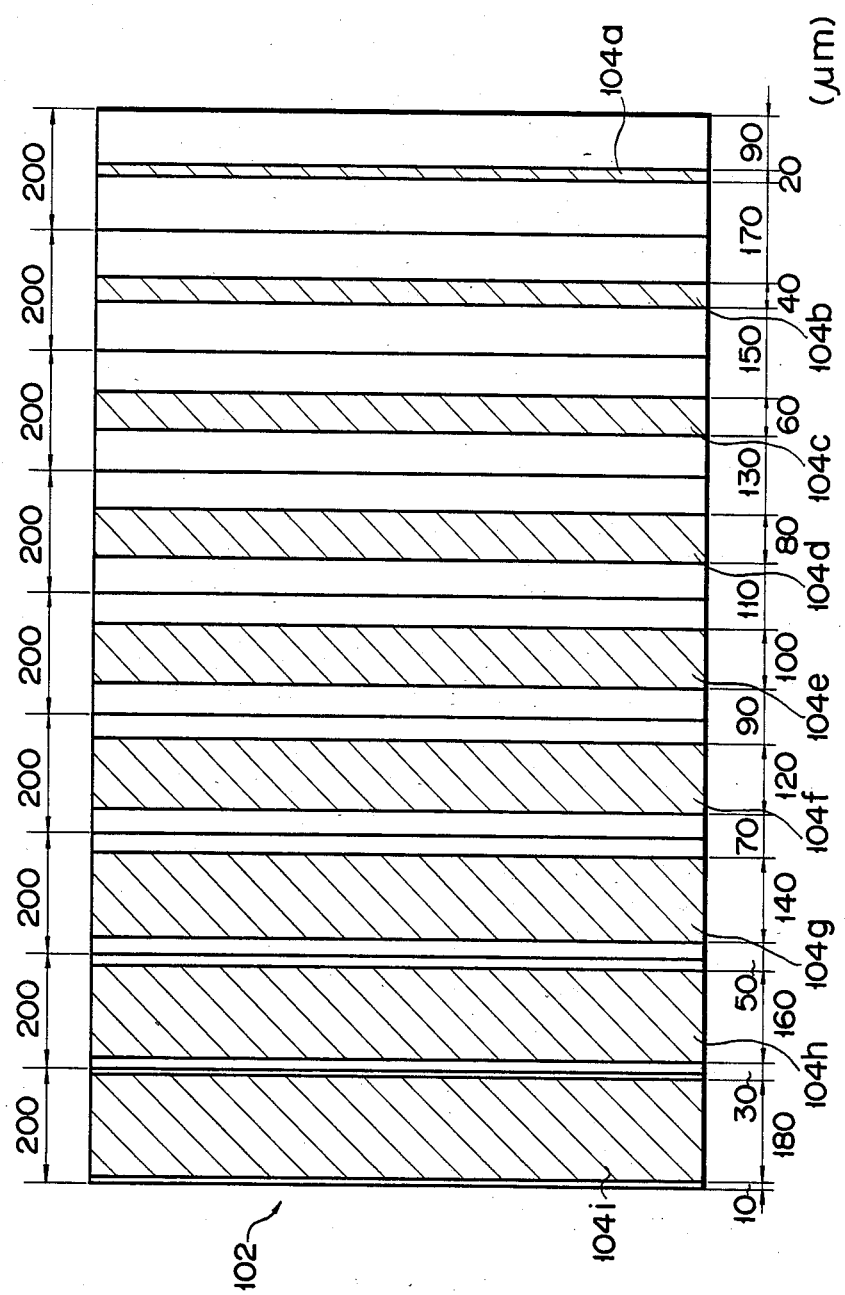

The shapes of the marks 100 and 120 will now be described in more detail. As shown in FIG. 9, the mark 100 has a coarse alignment pattern 102 and a fine alignment pattern 106. Lines 108 of the fine alignment pattern 106 have a line width of 10 μm. The lines 108 are formed at a pitch of 20 μm with interspaces of 10 μm therebetween. As shown enlarged in FIG. 10, the coarse alignment pattern 102 has lines 104 (104a to 104i) having different widths (as indicated by the hatched areas). As shown in FIG. 10, the line 104a has a width of 20 μm, the line 104b has a width of 40 μm, and the lines 104c to 104i have widths which increase arithmetically. The line 104i has a width of 180 μm. The lines 104a to 104i are formed at a pitch of 200 μm. Thus, the interspaces between the lines 104a and 104b, between the lines 104b and 104c, and so on are different from each other; and are 170 μm, 150 μm, and so on.

Figure 11:
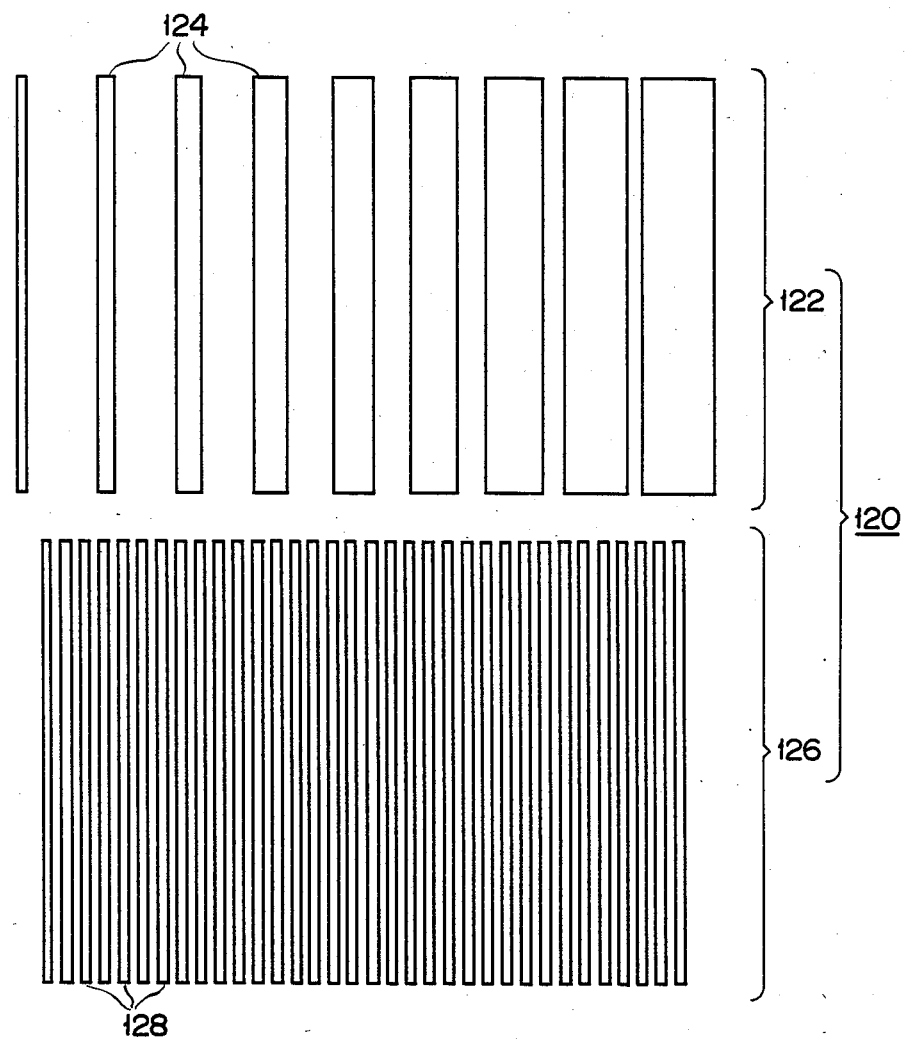
Figure 12:
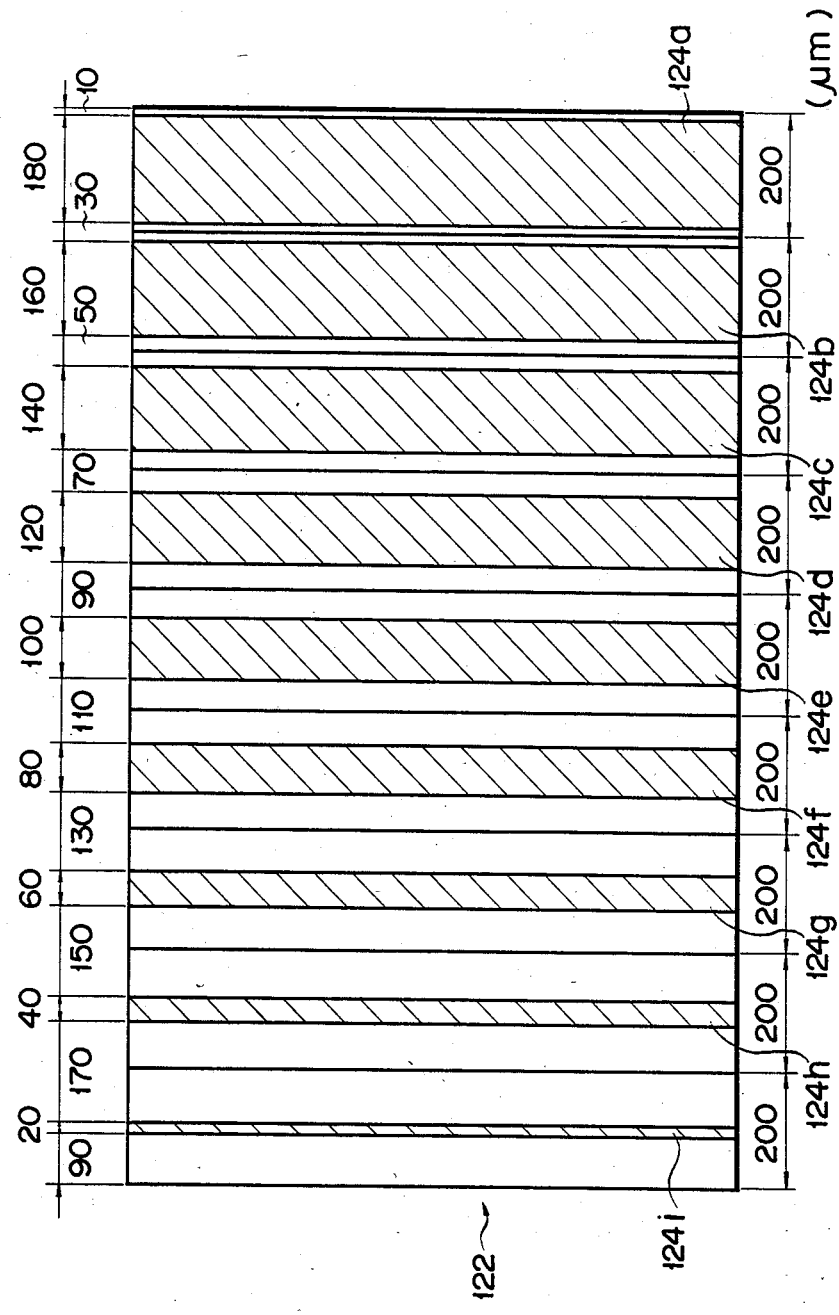

The mark 120 has a coarse alignment pattern 122 and a fine alignment pattern 126, as shown in FIG. 11. Lines 128 of the fine alignment pattern 126 have a width of 10 μm and are formed at a pitch of 20 μm as in the case of the lines 108 of the fine alignment pattern 106. The coarse alignment pattern 122 has lines 124 (124a to 124i) and is symmetrical with the coarse alignment pattern 102 with respect to the central line 104e. More specifically, the line 124a has a width of 180 μm, the line 124b has a width of 160 μm, the line 124c has a width of 140 μm, and the lines 124d to 124i have widths which decrease arithmetically, as shown in FIG. 12. The line 124i has a width of 20 μm. The marks 100 and 120 are formed on the wafer 74 and the quartz substrate 80, respectively, such that the fine alignment patterns 106 and 126 are opposite to each other, and the coarse alignment patterns 102 and 122 are also opposite to each other. In this case, the lines 104a and 124a are opposite to each other, the lines 104b and 124b are opposite to each other, the lines 104c and 124c are opposite to each other, and so on. When the lines 104a and 124a, 104b and 124b, 104c and 124c, and so on respectively are opposite to each other and have their central lines corresponding to each other, the overlapping area of the coarse alignment patterns 102 and 122 becomes at its maximum. The relative positions of the coarse alignment pattern 102 and the fine alignment pattern 106 or those of the coarse alignment pattern 122 and the fine alignment pattern 126 are determined such that the overlapping area between the fine alignment patterns 106 and 126 becomes at its maximum.

Figure 13:
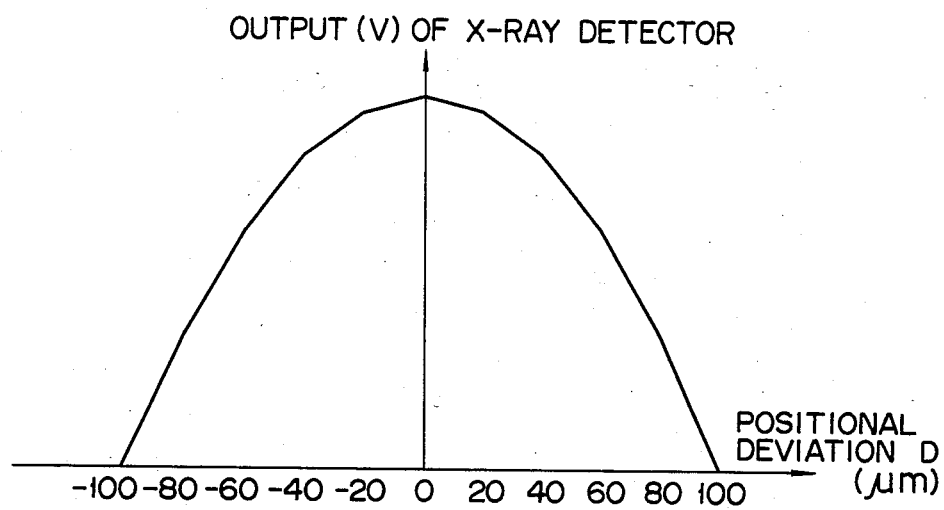
Figure 14:
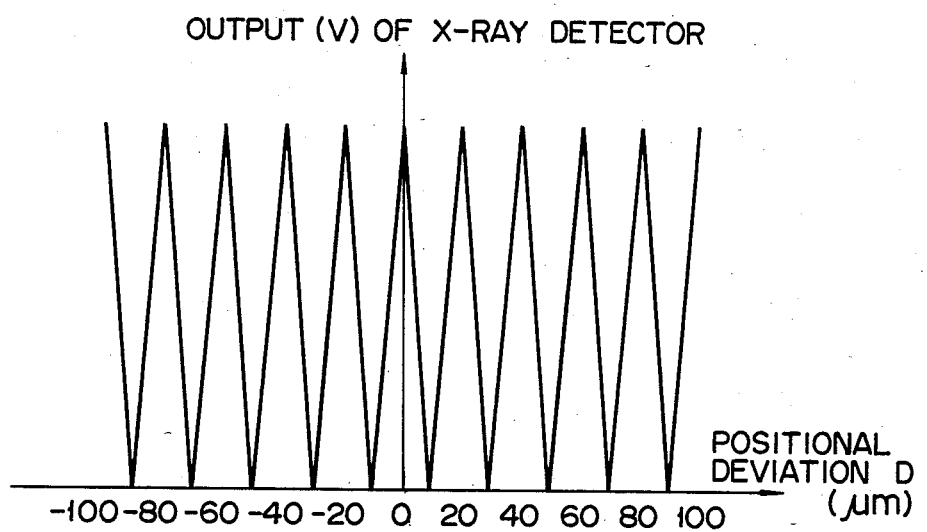
Figure 15:
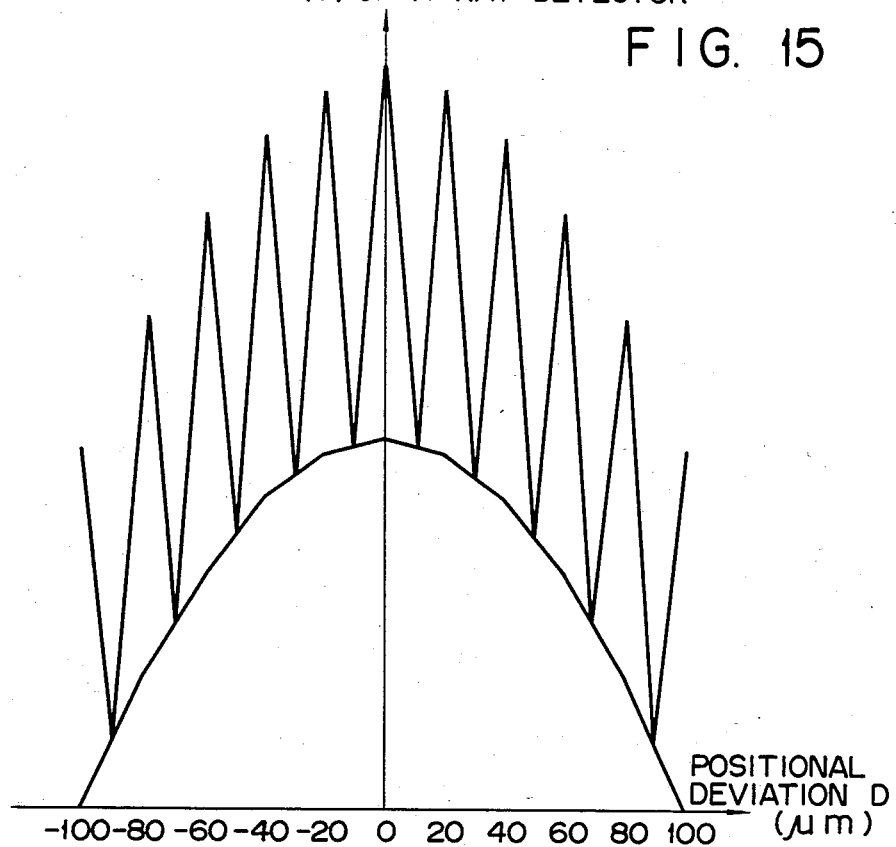
Figure 16:
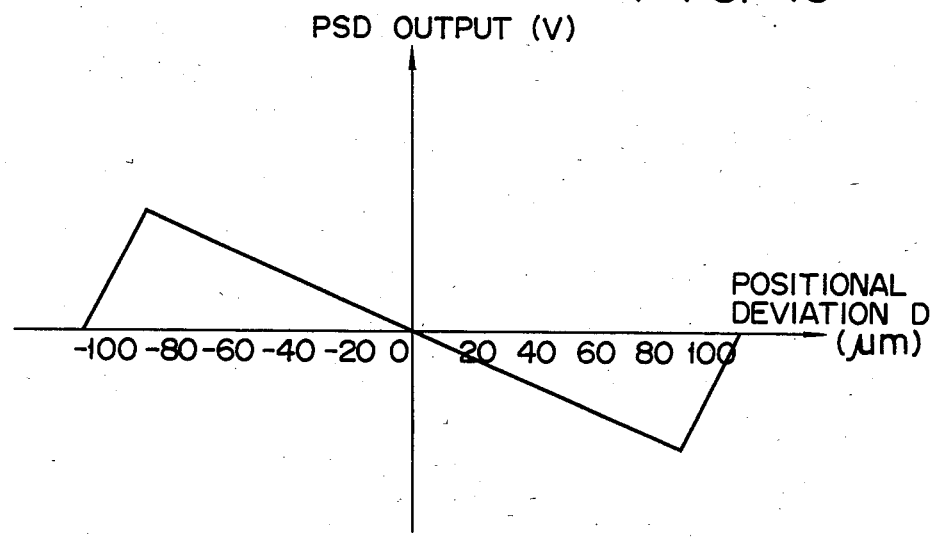

The operation according to the method of the present invention will now be described. When the shutter 46 is opened to allow the ultraviolet light from the light source 50 to irradiate onto the mask 78, an electron beam is emitted from a photoelectric film 84 of the mask 78. The electron beam is focused onto the wafer 74 by a magnetic field generated by the coil 54 powered by the coil power supply 56 and by an electric field applied between the mask 78 and the wafer 74 by the DC power supply 86. An electron beam emitted from the mark 120 on the mask 78 is focused onto the mark 100 of the wafer 74. The intensity of X-rays emitted from the mark 100 this time is different in accordance with the rate of change in the overlapping area between the marks 100 and 120. Since the coarse alignment patterns 100 and 120 have lines of widths which change arithmetically as shown in FIGS. 10 and 12, the overlapping area of the coarse alignment patterns and the X-ray output change quadratically as a function of deviation D, as shown in FIG. 13. However, the overlapping area of the fine alignment patterns change according to a triangular wave as a function of deviation D, as shown in FIG. 14. Therefore, as shown in FIG. 15, the output from the X-ray detector 70 changes in a pattern which is obtained by superposing the quadratic curve shown in FIG. 13 and the triangular wave shown in FIG. 14. It is difficult to detect the deviation in coarse alignment in accordance with the output pattern from the X-ray detector. Therefore, the deflection coil 58 is operated by the coil power supply 60 to scan the electron beam. A current including an AC rectangular component is supplied to the deflection coil 58 so as to perform AC deflection of the magnetic field and to modulate the electron beam. In this case, the scan width of the electron beam is preset to be a multiple integral of the pitch of the fine alignment pattern, e.g., 20 to 60 μm. Synchronous detection of the output signal from the X-ray detector is performed using the modulated signal of the electron beam. In other words, the modulated frequency component is extracted from the modulated output signal so as to obtain the relative amplitude of the frequency component. This becomes a PSD output. In this case, since a rectangular wave is selected as a modulated wave and the amplitude (beam scan width) is preset to be a multiple integral of the pitch of the fine alignment pattern, the modulated frequency component of the X-ray output from the fine alignment pattern 126 becomes 0. Therefore, the output characteristics after synchronous detection correspond to the X-ray component generated from the coarse alignment pattern 122. Since the output characteristics of the X-ray from the coarse alignment pattern 122 are substantially quadratic as shown in FIG. 13, the PSD output theoretically given as a differential of this quadratic curve changes substantially linearly as a function of deviation, as shown in FIG. 16. As may be seen from FIG. 16, when these marks 100 and 120 are used, since the linear range of the PSD output is ±90 μm and since no flat region (nonsensitive region) is present, the detection range of deviation in coarse alignment becomes ±90 μm.

Position correction can be performed by deflecting the electron beam by the deflection coil 58 or by moving the carriage 64 in accordance with the deviation obtained in coarse alignment. Upon coarse alignment, the mask 78 and the wafer 74 can be aligned within a range to allow alignment with the fine alignment patterns. In fine alignment, the deviation can be reduced to 0 by aligning the positions of the mask 78 and the wafer 74 at the vertex of the triangular wave of the X-ray output (FIG. 15). When the above-mentioned synchronous detection method is adopted, high-resolution output characteristics are obtained and high-precision fine alignment can be performed. Fine alignment can also be performed by position correction of the electron beam by the deflection coil 58 or by the movement of the carriage 64.

When alignment is completed, the resist pattern formed within the region in which the mark 120 is not formed is transferred onto the resist film 76 on the wafer 74.

According to the present invention, two step alignment, that is, coarse and fine alignment can be performed without requiring an increase in the number of alignment marks or X-ray detectors. In coarse alignment, the signal component from the fine alignment patterns can be removed, and PSD output characteristics without a nonsensitive region and with a wide detection range can be obtained by simply applying an AC deflection magnetic field of a small amplitude. Thus, coarse alignment can be completed within a short period of time. As a consequence, the time required for alignment can be shortened, and the projecting throughput of an electron beam projecting apparatus can be improved significantly. Since a deflection magnetic field of a large amplitude need not be applied, a decrease in the alignment precision due to heat generated by the deflection coil and the AC loss of the focusing coil using a superconductive magnet can be prevented.

Figure 17:
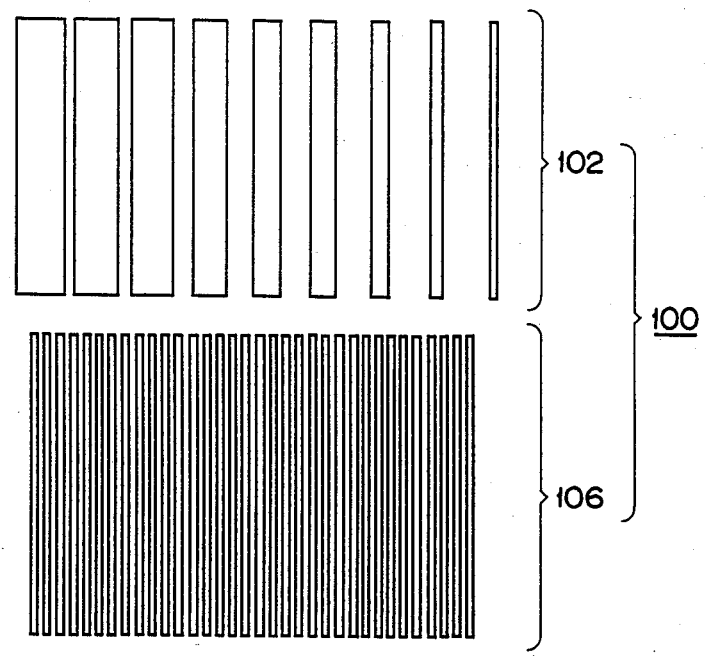
FIGS. 17 and 18 are views showing marks according to another embodiment of the present invention.
Figure 18:
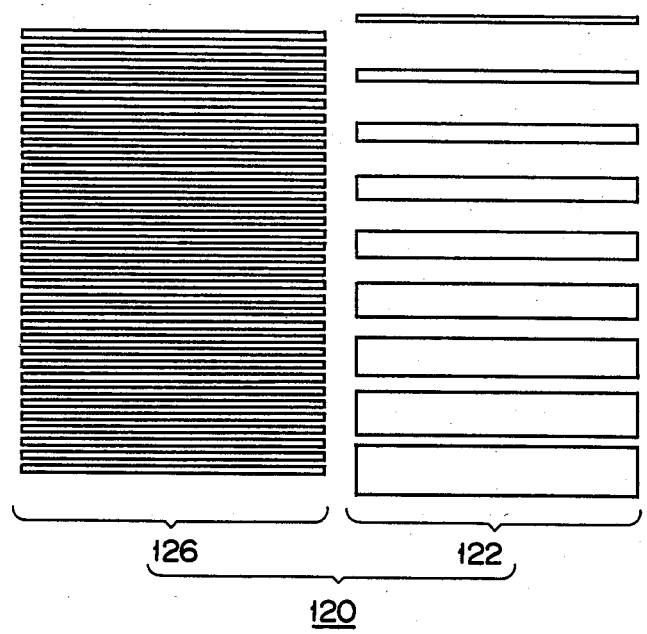

The above embodiment is directed toward alignment along one axis. However, the present invention is not limited to this and can be applied to alignment along two axes. FIGS. 17 and 18 show the shapes of marks 100 and 120 for performing alignment along two axes. Alignment along two axes can be performed in the same manner as alignment along one axis. However, the modulation frequencies along the respective axes are different from each other. When different modulation frequencies are used, synchronous detection through a filter results in a separation into two components. Therefore, coarse and fine alignment along each axis can be performed in the same manner as alignment along one axis.

Alignment can be performed with a coarse alignment pattern alone without forming a fine alignment pattern. A wide detection range can be obtained even if the scan width of the electron beam is decreased. The material of the mark 100 formed on the wafer is not limited to a heavy metal such as tantalum or tungsten or a heavy metal compound, but can be any material which emits an energy beam such as an X-ray upon irradiation with an electron beam.

The minimum line width in the coarse alignment pattern is 20 μm in the above-mentioned embodiment but is not restricted thereto. In order to obtain a satisfactory detection range ±100 μm as an alignment detection range, the line pitch must be preset to be about 200 μm. Since 10 lines or more are preferably formed in a mark, the minimum width of the line preferably falls within a range between 10 and 20 µm.

What is claimed is:

1. A method of aligning first and second members utilizing first and second marks respectively provided on the first and second members, comprising the steps of:

irradiating the first member with an energy beam so as to allow the first mark to emit an electron beam;

reciprocally deflecting the electron beam to scan the second mark;

detecting a second different energy beam emitted from the second mark upon irradiation of the second member with the electron beam;

synchronously detecting a detection signal of the second energy beam so as to obtain a phase sensitive detection signal; and obtaining a relative positional deviation between the first and second members in accordance with at least one of the detection signals and the phase sensitive detection signals and aligning the first and second members in accordance with the deviation, the first mark having a first alignment pattern consisting of lines, which emit the electron beam upon irradiation with the energy beam, and spaces between said lines, the second mark having a second alignment pattern consisting of lines which emit the second different energy beam upon irradiation with the electron beam, and spaces between the lines of said second alignment pattern, the second energy beam emitted from the lines being stronger than that emitted from the spaces, the lines of the first and second alignment patterns becoming larger in width from one end to the other end of each alignment pattern, and an overlapping area between the lines at the first and second alignment patterns changing approximately in accordance with a quadratic curve or a curve given by an equation of higher degree, which represents the positional deviation between the first and second members.

2. A method according to claim 1, wherein the first member is a photoelectric mask having a photoelectric film and a mask pattern, the second member is a wafer having a resist film onto which the mask pattern is to be transferred, and an X-ray is emitted as the second energy beam from the second mark of the wafer.

3. A method according to claim 2, wherein the first and second marks respectively further have third and fourth alignment patterns consisting of lines of the same width and arranged at a predetermined pitch, the electron beam is reciprocally deflected in accordance with a modulated signal of a rectangular wave so as to scan the second mark within a scan width which is an integer multiple of the pitch of the lines of the fourth alignment pattern, coarse alignment is performed in accordance with the phase sensitive detection signal, and fine alignment is performed in accordance with the detection signal.

4. A method according to claim 3, wherein the wafer is a silicon wafer, and the lines of the second mark consist of a heavy metal selected from the group consisting of tantalum, tungsten and molybdenum or a heavy metal compound.

5. A method according to claim 4, wherein the lines of the first and second coarse alignment patterns change in width in arithmetic series and are arranged at a predetermined pitch, and the first and second coarse alignment patterns are opposite to each other such that the line of the maximum width faces that of the minimum width.

6. A method according to claim 5, wherein the scan width of the electron beam is 20 to 60 µm.

* * * * *